US012702016B2

(12) United States Patent
Jeon et al.

(10) Patent No.: US 12,702,016 B2
(45) Date of Patent: Aug. 4, 2026

(54) SEMICONDUCTOR PACKAGE WITH HORIZONTALLY SPACED CHIP AND INTERPOSER SUBSTRATE

(71) Applicant: SAMSUNG ELECTRONICS CO., LTD., Suwon-si (KR)

(72) Inventors: Taejun Jeon, Suwon-si (KR); Junwoo Park, Suwon-si (KR); Yongkwan Lee, Suwon-si (KR); Seung Hwan Kim, Suwon-si (KR); Jongwan Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 456 days.

(21) Appl. No.: 18/195,429

(22) Filed: May 10, 2023

(65) Prior Publication Data

US 2024/0079342 A1 Mar. 7, 2024

(30) Foreign Application Priority Data

Sep. 1, 2022 (KR) ........................ 10-2022-0110688
Oct. 5, 2022 (KR) ........................ 10-2022-0126961

(51) Int. Cl.
*H01L 23/544* (2006.01)
*H01L 23/538* (2006.01)
(Continued)

(52) U.S. Cl.
CPC ............ *H10W 46/00* (2026.01); *H10B 80/00* (2023.02); *H10W 70/611* (2026.01); *H10W 74/01* (2026.01); *H10W 74/117* (2026.01);

*H10W 90/00* (2026.01); *H10W 90/401* (2026.01); *H10W 46/301* (2026.01);
(Continued)

(58) Field of Classification Search
CPC ... H01L 23/544; H01L 21/56; H01L 23/3128; H01L 23/5385; H01L 25/0657; H01L 25/105; H01L 25/50; H01L 24/16; H01L 24/32; H01L 24/73; H01L 2223/54426; H01L 2224/16145; H01L 2224/16227; H01L 2224/32145; H01L 2224/32225; H10B 80/00
See application file for complete search history.

(56) References Cited

U.S. PATENT DOCUMENTS 8,063,477 B2 11/2011 Pagaila et al.
8,084,849 B2 12/2011 Chow et al.
(Continued)

FOREIGN PATENT DOCUMENTS

KR 10-1813435 12/2017
KR 10-2114454 B1 5/2020
KR 10-2021-0088305 A 7/2021

*Primary Examiner* — Thanh Y. Tran
(74) *Attorney, Agent, or Firm* — Morgan, Lewis & Bockius LLP

(57) ABSTRACT

A semiconductor package including: a first substrate; a first semiconductor chip and a second substrate horizontally spaced apart from each other on the first substrate; and a molding layer on the first substrate, the first semiconductor chip and the second substrate, wherein a thickness of the first semiconductor chip is greater than a thickness of the second substrate, wherein the molding layer exposes a top surface of the second substrate, and wherein the second substrate has fiducial marks exposed on the top surface of the second substrate.

6 Claims, 12 Drawing Sheets

10

(51) Int. Cl.

| | |
|---|---|
| *H01L 25/065* | (2023.01) |
| *H10B 80/00* | (2026.01) |
| *H10W 46/00* | (2026.01) |
| *H10W 70/60* | (2026.01) |
| *H10W 74/01* | (2026.01) |
| *H10W 74/10* | (2026.01) |
| *H10W 90/00* | (2026.01) |
| H10W 74/15 | (2026.01) |

(52) U.S. Cl.
CPC .......... *H10W 74/15* (2026.01); *H10W 90/722* (2026.01); *H10W 90/724* (2026.01); *H10W 90/732* (2026.01); *H10W 90/734* (2026.01)

(56)   References Cited

U.S. PATENT DOCUMENTS

| | | | |
|---|---|---|---|
| 9,396,300 B2 | 7/2016 | Wang et al. | |
| 9,977,439 B2 | 5/2018 | Park et al. | |
| 10,811,358 B2 | 10/2020 | Ha et al. | |
| 11,171,115 B2 | 11/2021 | Manipatruni et al. | |
| 2007/0031743 A1* | 2/2007 | Bijnen ................. | H01L 23/544 |
| | | | 430/30 |
| 2019/0139937 A1* | 5/2019 | Kuo .................... | H01L 23/5389 |
| 2022/0157728 A1 | 5/2022 | Kirby | |

\* cited by examiner

SEMICONDUCTOR PACKAGE WITH HORIZONTALLY SPACED CHIP AND INTERPOSER SUBSTRATE

CROSS-REFERENCE TO RELATED APPLICATIONS

This U.S. nonprovisional patent application claims priority under 35 U.S.C. § 119 to Korean Patent Application Nos. 10-2022-0110688 filed on Sep. 1, 2022 and 10-2022-0126961 filed on Oct. 5, 2022 in the Korean Intellectual Property Office, the disclosures of which are incorporated by reference herein in their entireties.

TECHNICAL FIELD

The present inventive concept relate to a semiconductor package, and more particularly, to a semiconductor package including a semiconductor chip and a substrate that are horizontally spaced apart from each other and a method of fabricating the same.

DISCUSSION OF RELATED ART

The provision of a semiconductor package facilitates the use of an integrated circuit chip in electronic products. A semiconductor package is typically designed with a semiconductor chip mounted on a printed circuit board, connected electrically via bonding wires or bumps. As the electronics industry continues to evolve, efforts have been made to enhance the reliability and durability of semiconductor packages through ongoing research and development.

SUMMARY

Some embodiments of the present inventive concept provide a semiconductor package with enhanced structural stability.

Some embodiments of the present inventive concept provide a semiconductor package with increased productivity.

Some embodiments of inventive concept provide a semiconductor package with enhanced thermal stability.

According to some embodiments of the present inventive concept, a semiconductor package includes: a first substrate; a first semiconductor chip and a second substrate horizontally spaced apart from each other on the first substrate; and a molding layer on the first substrate, the first semiconductor chip and the second substrate, wherein a thickness of the first semiconductor chip is greater than a thickness of the second substrate, wherein the molding layer exposes a top surface of the second substrate, and wherein the second substrate has fiducial marks exposed on the top surface of the second substrate.

According to some embodiments of the present inventive concept, a semiconductor package includes: a first substrate having a first region and a second region that are horizontally spaced apart from each other; a second substrate on the first region of the first substrate; a semiconductor chip on the second region of the first substrate; a chip stack on the second substrate; and a molding layer on the first substrate, the second substrate and the semiconductor chip, wherein a first top surface of the molding layer on the first region is closer to the first substrate than a second top surface of the molding layer on the second region.

According to some embodiments of the present inventive concept, a method of fabricating a semiconductor package includes: mounting a semiconductor chip on a first substrate; mounting a second substrate that is horizontally spaced apart from the semiconductor chip on the first substrate; and forming a molding layer around the semiconductor chip and the second substrate on the first substrate, wherein the molding layer exposes a top surface of the second substrate.

DETAIL PARTED DESCRIPTION OF EMBODIMENTS

The following will now describe a semiconductor package according to some embodiments of the present inventive concept with reference to the accompanying drawings.

Figure 1:
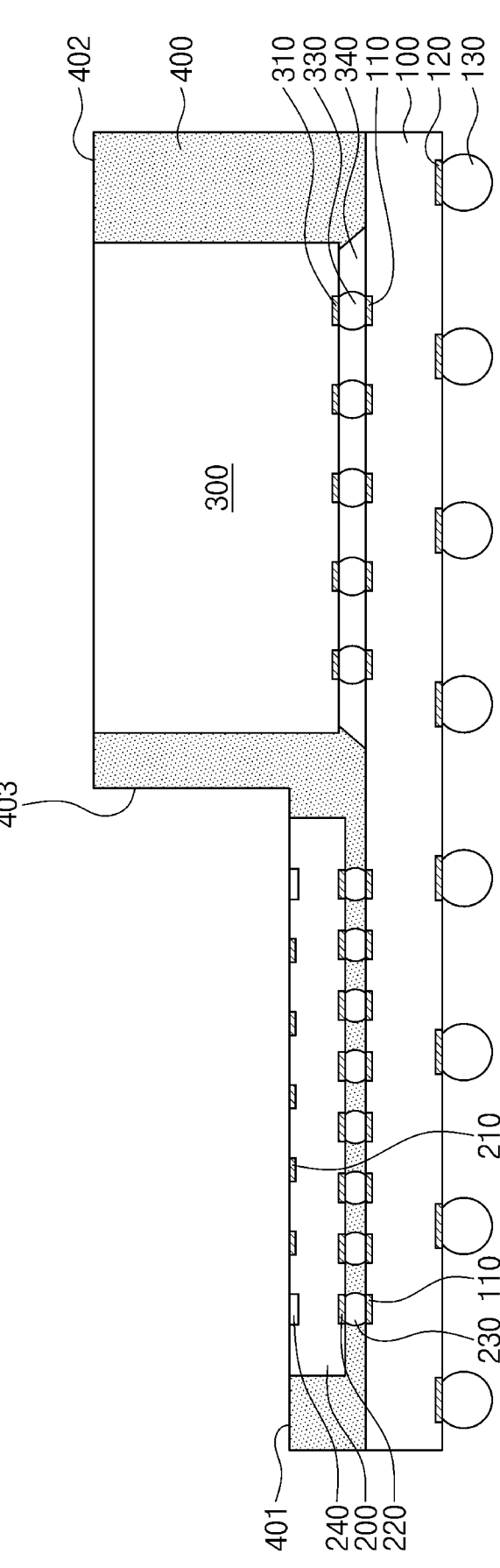
FIG. 1 illustrates a cross-sectional view showing a semiconductor package according to some embodiments of the present inventive concept.

FIG. 1 illustrates a cross-sectional view showing a semiconductor package according to some embodiments of the present inventive concept.

Referring to FIG. 1, a semiconductor package 10 may include a first substrate 100, substrate connection terminals 130, first connection terminals 230, second connection terminals 330, a second substrate 200, a first semiconductor chip 300, and a first molding layer 400.

The first substrate 100 may be provided. The first substrate 100 may be a printed circuit board (PCB). The first substrate 100 may have a structure in which one or more dielectric layers are alternately stacked with one or more wiring layers. The first substrate 100 may have upper substrate pads 110 disposed on a top surface thereof. The upper substrate pads 110 may be exposed on the top surface of the first substrate 100. The first substrate 100 may have lower substrate pads 120 disposed on a bottom surface thereof. The lower substrate pads 120 may be exposed on the bottom surface of the first substrate 100. The upper substrate pads 110 may be electrically connected through the wiring layer to the lower substrate pads 120. In this description, the phrase "electrically connected/coupled" may include a direct connection/coupling or an indirect connection/coupling through other conductive component(s). The upper substrate pads 110 and the lower substrate pads 120 may include a metallic material, such as one or more of copper (Cu), aluminum (Al), and nickel (Ni).

The substrate connection terminals 130 may be disposed on the bottom surface of the first substrate 100. The substrate connection terminals 130 may be laterally spaced apart from each other. For example, the substrate connection terminals 130 may be disposed on the lower substrate pads 120 provided on the bottom surface of the first substrate 100. The substrate connection terminals 130 may be coupled to the lower substrate pads 120. The substrate connection terminals 130 may include solder balls or solder bumps. The substrate connection terminals 130 may be an alloy including at least one selected from tin (Sn), silver (Ag), copper (Cu), nickel (Ni), bismuth (Bi), indium (In), antimony (Sb), and cerium (Ce). Based on type of the substrate connection terminals 130, the semiconductor package 10 may be a ball grid array (BGA) type, a fine ball-grid array (FBGA) type, or a land grid array (LGA) type.

The second substrate 200 may be provided on the first substrate 100. The second substrate 200 may include therein at least one dielectric pattern and at least one wiring pattern. Alternatively, the second substrate 200 may include a through electrode that penetrates therethrough.

The second substrate 200 may have first substrate pads 210 disposed on a top surface thereof. The first substrate pads 210 may be exposed on the top surface of the second substrate 200. The second substrate 200 may have second substrate pads 220 disposed on a bottom surface thereof. The second substrate pads 220 may be exposed on the bottom surface of the second substrate 200. The first substrate pads 210 may be electrically connected to the second substrate pads 220 through the wiring patterns or the through electrodes. The first substrate pads 210 and the second substrate pads 220 may include a metallic material, such as one or more of copper (Cu), aluminum (Al), and nickel (Ni).

The second substrate 200 may have fiducial marks 240 provided on the top surface thereof. The fiducial marks 240 may be exposed on the top surface of the second substrate 200. The fiducial marks 240 may be horizontally spaced apart from each other. The first substrate pads 210 may be disposed between the fiducial marks 240 that are spaced apart from each other on the second substrate 200. For example, the first substrate pads 210 may be provided on a central region of the second substrate 200, and the fiducial marks 240 may be provided on an outer region of the second substrate 200. The fiducial marks 240 may be located closer to an edge of the second substrate 200 than the first substrate pads 210. The fiducial marks 240 may be buried in the second substrate 200. The fiducial marks 240 may have their top surfaces exposed on the top surface of the second substrate 200. Differently from that shown, the fiducial marks 240 may protrude from the top surface of the second substrate 200. In this case, bottom surfaces of the fiducial marks 240 may be in contact with the top surface of the second substrate 200. For example, the fiducial marks 240 may be disposed on the top surface of the second substrate 200.

The central region of the second substrate 200 on which the first substrate pads 210 are provided may be an area where a semiconductor chip, a semiconductor package, or an electronic element is mounted. The fiducial marks 240 may be alignment keys for mounting the semiconductor chip or the semiconductor package on the second substrate 200. In other words, the fiducial marks 240 may serve as alignment indicators to properly position the semiconductor chip or semiconductor package on the second substrate 200. The fiducial marks 240 may reduce misalignment of the semiconductor chip or the semiconductor package on the second substrate 200.

The second substrate 200 may be flip-chip mounted on the first substrate 100. The first connection terminals 230 may be provided between the second substrate 200 and the first substrate 100. The first connection terminals 230 may be disposed to correspond to the second substrate pads 220 of the second substrate 200 and to the upper substrate pads 110 of the first substrate 100. For example, each of the first connection terminals 230 may be coupled to one of the second substrate pads 220 and to one of the upper substrate pads 110. The second substrate 200 may be mounted through the first connection terminals 230 on the first substrate 100. The second substrate 200 may be electrically connected through the first connection terminals 230 to the first substrate 100. The first connection terminals 230 may include solder balls or solder bumps. The first connection terminals 230 may be an alloy including at least one selected from tin (Sn), silver (Ag), copper (Cu), nickel (Ni), bismuth (Bi), indium (In), antimony (Sb), and cerium (Ce). The first connection terminals 230 may be surrounded by the first molding layer 400 which will be discussed below.

The first semiconductor chip 300 may be provided on the first substrate 100. On the first substrate 100, the first semiconductor chip 300 may be disposed horizontally spaced apart from the second substrate 200. The first semiconductor chip 300 may have a thickness greater than that of the second substrate 200. A top surface of the first semiconductor chip 300 may be located at a higher vertical level from the top surface of the first substrate 100 than the top surface of the second substrate 200. For example, the top surface of the second substrate 200 may be closer to the top surface of the first substrate 100 than the top surface of the second semiconductor chip 300.

The first semiconductor chip 300 may include a logic chip. The logic chip may include an application specific integrated circuit (ASIC) chip or an application processor (AP) chip. Alternatively, the logic chip may include a central processing unit (CPU) or a graphic processing unit (GPU). The ASIC chip may include an application specific integrated circuit (ASIC).

The first semiconductor chip 300 may include first chip pads 310 provided on a bottom surface of the first semiconductor chip 300. The first chip pads 310 may be exposed on the bottom surface of the first semiconductor chip 300. The first chip pads 310 may include a metallic material, such as one or more of copper (Cu), aluminum (Al), and nickel (Ni).

The first semiconductor chip 300 may be flip-chip mounted on the first substrate 100. The second connection terminals 330 may be provided between the first semiconductor chip 300 and the first substrate 100. The second connection terminals 330 may be disposed to correspond to the first chip pads 310 of the first semiconductor chip 300 and to the upper substrate pads 110 of the first substrate 100. For example, each of the second connection terminals 330 may be coupled to one of the first chip pads 310 and to one of the upper substrate pads 110. The first semiconductor chip 300 may be mounted through the second connection terminals 330 on the first substrate 100. The first semiconductor chip 300 and the second substrate 200 may be electrically connected to each other through the first substrate 100. The second connection terminals 330 may include solder balls or solder bumps. The second connection terminals 330 may be an alloy including at least one selected from tin (Sn), silver (Ag), copper (Cu), nickel (Ni), bismuth (Bi), indium (In), antimony (Sb), and cerium (Ce).

A first under-fill 340 may be provided between the first semiconductor chip 300 and the first substrate 100. The first under-fill 340 may surround the second connection terminals 330 between the first semiconductor chip 300 and the first substrate 100. The first under-fill 340 may fill a gap between the second connection terminals 330.

The first molding layer 400 may be provided on the first substrate 100. The first molding layer 400 may cover the top surface of the first substrate 100. The first molding layer 400 may not expose the top surface of the first substrate 100. The first molding layer 400 may have a lateral surface vertically aligned with that of the first substrate 100. The first molding layer 400 may fill a space between the second substrate 200 and the first semiconductor chip 300.

On the first substrate 100, the first molding layer 400 may surround the second substrate 200 and the first semiconductor chip 300. The first molding layer 400 may expose the top surface of the second substrate 200, while surrounding a lateral surface of the second substrate 200. For example, the first molding layer 400 may be disposed on opposite sides of the second substrate 200 while exposing the upper surface of the second substrate 200. The first molding layer 400 may have a first top surface 401 coplanar with the top surface of the second substrate 200. Differently from that shown, the first molding layer 400 may cover at least a portion of the lateral surface of the second substrate 200. In this case, the top surface of the first molding layer 400 may not be coplanar with that of the second substrate 200. The first molding layer 400 may extend between the second substrate 200 and the first substrate 100. The first molding layer 400 may surround the first connection terminals 230 between the second substrate 200 and the first substrate 100. The first molding layer 400 may fill a gap between the first connection terminals 230. The first molding layer 400 may expose the top surface of the first semiconductor chip 300, while surrounding a lateral surface of the first semiconductor chip 300.

The first molding layer 400 may have a second top surface 402 coplanar with the top surface of the first semiconductor chip 300. The first top surface 401 may be located at a lower vertical level from the top surface of the first substrate 100 than the second top surface 402. The first top surface 401 may be closer than the second top surface 402 to the first substrate 100. For example, the first molding layer 400 may have a step difference between the second substrate 200 and the first semiconductor chip 300. In more detail, the first molding layer 400 may have an intermediate wall 403 positioned between neighboring lateral surfaces of the second substrate 200 and the first substrate 100. The intermediate wall 403 may connect to each other the first top surface 401 and the second top surface 402 that are positioned at different vertical levels. The intermediate wall 403 may be vertical with respect to the first substrate 100. The present inventive concept, however, is not limited thereto, and a shape of the intermediate wall 403 may be changed if necessary. For example, the intermediate wall 403 may be an inclined surface that is inclined toward the first semiconductor chip 300. The first molding layer 400 may include an epoxy molding compound (EMC).

In the semiconductor package 10 according to some embodiments of the present inventive concept, the first molding layer 400 may be provided to surround the second substrate 200 and the first semiconductor chip 300 that are horizontally spaced apart from each other on the first substrate 100. When the first semiconductor chip 300 is tested in a fabrication process for the semiconductor package 10, the first molding layer 400 provided on the first substrate 100 may prevent warpage of the first substrate 100 and thus the semiconductor package 10 may increase in structural stability. For example, when a force is applied to an outer region of the first substrate 100, the first molding layer 400 may prevent warpage of a central region of the first substrate 100. For instance, when a force is exerted on the outer portion of the first substrate 100, the first molding layer 400 may counteract the warping of the central portion of the first substrate 100. As the top surface of the second substrate 200 is exposed from the first molding layer 400, a semiconductor chip may be mounted on the second substrate 200 after the test of the first semiconductor chip 300. This may increase productivity of the semiconductor package 10. In addition, as the top surface of the first semiconductor chip 300 is exposed from the first molding layer 400, it may be possible to easily discharge heat generated from the first semiconductor chip 300 and to increase thermal stability of the semiconductor package 10.

Figure 2:
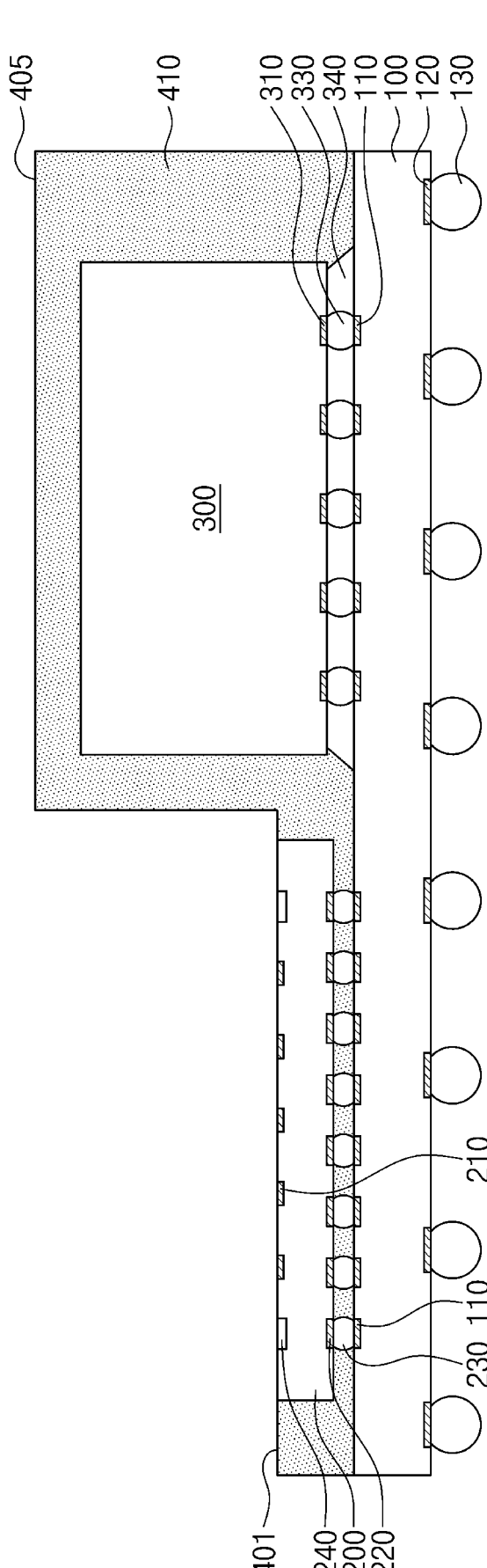
FIG. 2 illustrates a cross-sectional view showing a semiconductor package according to some embodiments of the present inventive concept.

FIG. 2 illustrates a cross-sectional view showing a semiconductor package according to some embodiments of the present inventive concept. For convenience of description, omission will be made to avoid a repetitive description of the same components as those discussed with reference to FIG. 1, and a difference thereof will be explained in detail. The same reference numerals will be allocated to the same components of the semiconductor package 10 mentioned above.

Referring to FIG. 2, a semiconductor package 11 may include a first substrate 100, substrate connection terminals 130, first connection terminals 230, second connection terminals 330, a second substrate 200, a first semiconductor chip 300, and a first molding layer 410.

The first substrate 100 may have a first region and a second region that are horizontally spaced apart from each other. The second substrate 200 may be provided on the first region of the first substrate 100. The first semiconductor chip 300 may be provided on the second region of the first substrate 100.

The first molding layer 410 may be provided on the first substrate 100. On the first substrate 100, the first molding layer 410 may surround the second substrate 200 and the first semiconductor chip 300. On the first region, the first molding layer 410 may expose a top surface of the second substrate 200, while surrounding a lateral surface of the second substrate 200. The first molding layer 410 on the first region may have a first top surface 401 coplanar with the top surface of the second substrate 200.

Different from the embodiment of FIG. 1, on the second region, the first semiconductor chip 300 may be surrounded by the first molding layer 410, and the first molding layer 410 may cover a top surface of the first semiconductor chip 300. In other words, the top surface of the first semiconductor chip 300 may not be exposed by the first molding layer 410. The first semiconductor chip 300 may be buried in the first molding layer 410. The first molding layer 410 on the second region may have a second top surface 405 located at a higher vertical level from a top surface of the first substrate 100 than the top surface of the first semiconductor chip 300. The second top surface 405 may be located at a higher vertical level from the top surface of the first substrate 100 than the first top surface 401.

In the semiconductor package 11 according to some embodiments of the present inventive concept, the first molding layer 410 may be provided to cover the top surface of the first semiconductor chip 300. This configuration may protect the first semiconductor chip 300 against external impact. Therefore, the structural stability of the semiconductor package 11 may be enhanced.

Figure 3:
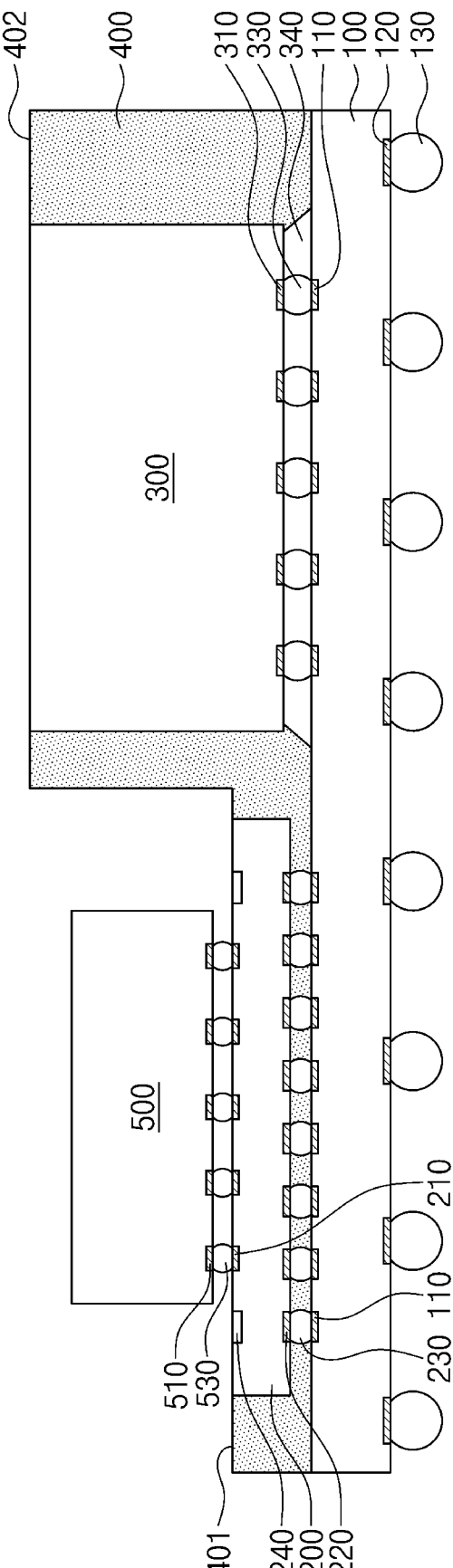
FIG. 3 illustrates a cross-sectional view showing a semiconductor package according to some embodiments of the present inventive concept.

FIG. 3 illustrates a cross-sectional view showing a semiconductor package according to some embodiments of the present inventive concept. For convenience of description, omission will be made to avoid a repetitive description of the same components as those discussed with reference to FIG.

1, and a difference thereof will be explained in detail. The same reference numerals will be allocated to the same components of the semiconductor package 10 mentioned above.

Referring to FIG. 3, a semiconductor package 12 may include a first substrate 100, substrate connection terminals 130, first connection terminals 230, second connection terminals 330, third connection terminals 530, a second substrate 200, a first semiconductor chip 300, a second semiconductor chip 500, and a first molding layer 400.

The first substrate 100 may be provided thereon with the second substrate 200 and the first semiconductor chip 300 that are horizontally spaced apart from each other. The first substrate 100 may be provided thereon with the first molding layer 400 that surrounds the second substrate 200 and the first semiconductor chip 300. The first molding layer 400 may have a first top surface 401 coplanar with a top surface of the second substrate 200 and a second top surface 402 coplanar with a top surface of the first semiconductor chip 300. The first top surface 401 may be located at a lower vertical level from a top surface of the first substrate 100 than the second top surface 402.

The second semiconductor chip 500 may be provided on the second substrate 200. The second semiconductor chip 500 may be disposed between fiducial marks 240 on the second substrate 200. The second semiconductor chip 500 may be disposed horizontally spaced apart from the first semiconductor chip 300. The second semiconductor chip 500 may be spaced apart from the first molding layer 400. The second semiconductor chip 500 may not be in contact with the first molding layer 400. The second semiconductor chip 500 may include a memory chip. For example, the memory chip may include a dynamic random access memory (DRAM).

The second semiconductor chip 500 may have second chip pads 510 disposed on a bottom surface thereof. The second chip pads 510 may be exposed on the bottom surface of the second semiconductor chip 500. The second chip pads 510 may include a metallic material, such as one or more of copper (Cu), aluminum (Al), and nickel (Ni).

The second semiconductor chip 500 may be flip-chip mounted on the second substrate 200. The third connection terminals 530 may be provided between the second semiconductor chip 500 and the second substrate 200. The third connection terminals 530 may be disposed on the bottom surface of the second semiconductor chip 500. The third connection terminals 530 may be disposed to correspond to the second chip pads 510 of the second semiconductor chip 500 and to the first substrate pads 210 of the second substrate 200. For example, each of the third connection terminals 530 may be coupled to one of the second chip pads 510 and to one of the first substrate pads 210. The second semiconductor chip 500 may be mounted through the third connection terminals 530 on the second substrate 200. The second semiconductor chip 500 may be electrically connected through the second substrate 200 to the first substrate 100. The third connection terminals 530 may include solder balls or solder bumps. The third connection terminals 530 may be an alloy including at least one selected from tin (Sn), silver (Ag), copper (Cu), nickel (Ni), bismuth (Bi), indium (In), antimony (Sb), and cerium (Ce). An under-fill may be provided to fill a space between the second semiconductor chip 500 and the second substrate 200 and to surround the third connection terminals 530.

Figure 4:
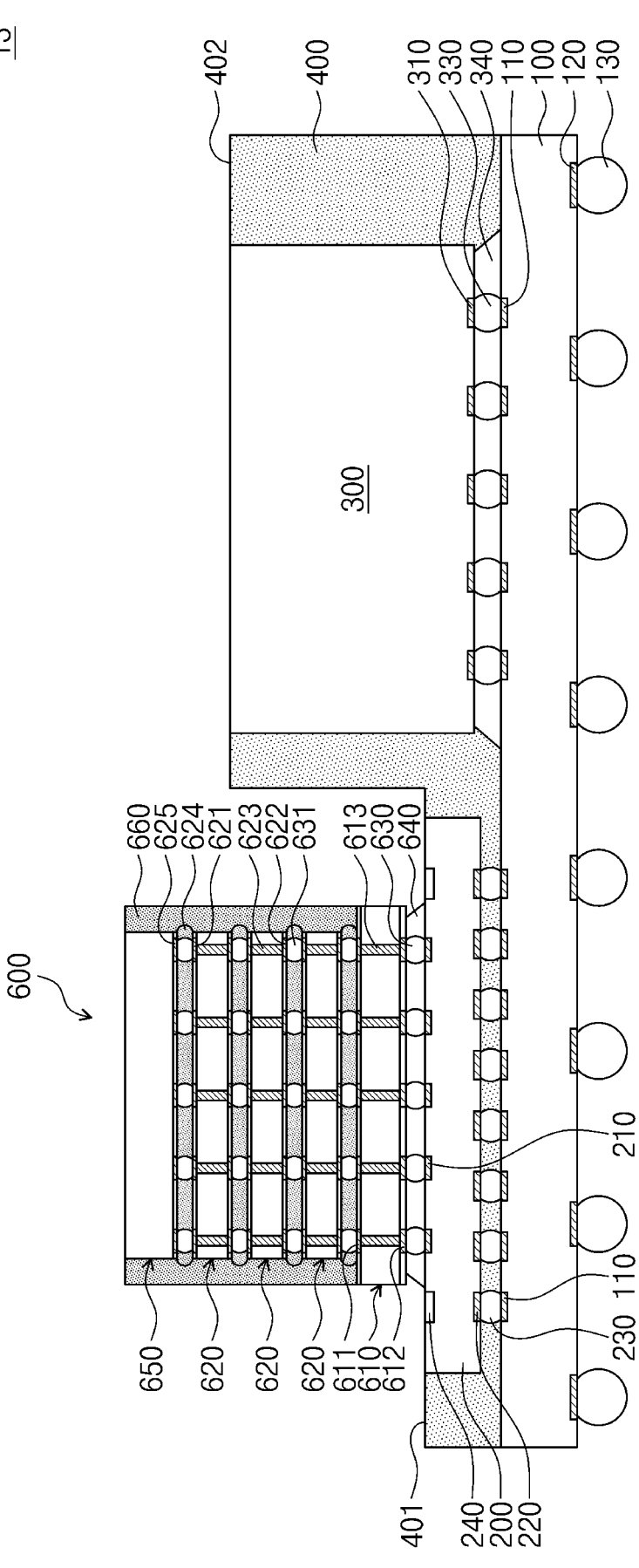
FIG. 4 illustrates a cross-sectional view showing a semiconductor package according to some embodiments of the present inventive concept.

FIG. 4 illustrates a cross-sectional view showing a semiconductor package according to some embodiments of the present inventive concept. For convenience of description, omission will be made to avoid a repetitive description of the same components as those discussed with reference to FIG. 1, and a difference thereof will be explained in detail. The same reference numerals will be allocated to the same components of the semiconductor package 10 mentioned above.

Referring to FIG. 4, a semiconductor package 13 may include a first substrate 100, substrate connection terminals 130, first connection terminals 230, second connection terminals 330, a second substrate 200, a first semiconductor chip 300, a chip stack 600, and a first molding layer 400.

The chip stack 600 may be provided on the second substrate 200. The chip stack 600 may include a plurality of semiconductor chips 610, 620, and 650 that are vertically stacked, non-conductive layers 624, and chip connection terminals 631.

The chip stack 600 may be disposed between fiducial marks 240 on the second substrate 200. The chip stack 600 may be disposed horizontally spaced apart from the first semiconductor chip 300. The chip stack 600 may be spaced apart from the first molding layer 400. The chip stack 600 may not be in contact with the first molding layer 400.

The chip stack 600 may include a base semiconductor chip 610, lower semiconductor chips 620, and an upper semiconductor chip 650. The lower semiconductor chips 620 and the upper semiconductor chip 650 may be sequentially stacked on the base semiconductor chip 610. The base semiconductor chip 610 may have a width greater than that of the upper semiconductor chip 650 and those of the lower semiconductor chips 620. The upper semiconductor chip 650 and the lower semiconductor chips 620 may have substantially the same width. The phrase "certain components are the same in terms of thickness, size, level, and/or width" may include an allowable tolerance possibly occurring during fabrication process. The base semiconductor chip 610 may include a logic chip, a controller chip, or a buffer chip. The upper semiconductor chip 650 and the lower semiconductor chips 620 may be of different types from the base semiconductor chip 610. The upper semiconductor chip 650 and the lower semiconductor chips 620 may include a memory chip.

The base semiconductor chip 610 may include first upper chip pads 611, first lower chip pads 612, and first through electrodes 613. The base semiconductor chip 610 may be a semiconductor chip disposed at bottom of the chip stack 600.

The first lower chip pads 612 may be provided on a bottom surface of the base semiconductor chip 610. The first lower chip pads 612 may be exposed on a circuit layer provided on the bottom surface of the base semiconductor chip 610. The first upper chip pads 611 may be provided on a top surface of the base semiconductor chip 610. The first upper chip pads 611 may be surrounded by a dielectric layer on the top surface of the base semiconductor chip 610. The first upper chip pads 611 may be exposed on the top surface of the base semiconductor chip 610. The first upper chip pads 611 and the first lower chip pads 612 may include a metallic material, such as one or more of copper (Cu), aluminum (Al), and nickel (Ni).

The first through electrodes 613 may be provided in the base semiconductor chip 610. The first through electrode 613 may vertically penetrate the base semiconductor chip 610. The first through electrodes 613 may be laterally spaced apart from each other. The first through electrodes 613 may be correspondingly coupled to the first upper chip pads 611 and the first lower chip pads 612. The first through electrodes 613 may include a metallic material, such as one or more of copper (Cu), titanium (Ti), tungsten (W), and a combination thereof.

The lower semiconductor chips 620 may be stacked on the base semiconductor chip 610 in a direction perpendicular to the top surface of the base semiconductor chip 610. The following will describe a configuration of one of the lower semiconductor chips 620.

The lower semiconductor chip 620 may include second upper chip pads 621, second lower chip pads 622, and second through electrodes 623.

The second lower chip pads 622 may be provided on a bottom surface of the lower semiconductor chip 620. The second lower chip pads 622 may be exposed on a circuit layer provided on the bottom surface of the lower semiconductor chip 620. The second upper chip pads 621 may be provided on a top surface of the lower semiconductor chip 620. The second upper chip pads 621 may be surrounded by a dielectric layer on the top surface of the lower semiconductor chip 620. The second upper chip pads 621 may be exposed on the top surface of the lower semiconductor chip 620. The second upper chip pads 621 and the second lower chip pads 622 may include a metallic material, such as one or more of copper (Cu), aluminum (Al), and nickel (Ni).

The second through electrodes 623 may be provided in the lower semiconductor chip 620. The second through electrode 623 may vertically penetrate the lower semiconductor chip 620. The second through electrodes 623 may be laterally spaced apart from each other. The second through electrodes 623 may be correspondingly coupled to the second upper chip pads 621 and the second lower chip pads 622. The second through electrodes 623 may include a metallic material, such as one or more of copper (Cu), titanium (Ti), tungsten (W), and a combination thereof.

The upper semiconductor chip 650 may be disposed on the lower semiconductor chips 620. The upper semiconductor chip 650 may be a semiconductor chip disposed at top of the chip stack 600. The upper semiconductor chip 650 may have third lower chip pads 625 provided on a bottom surface thereof. The third lower chip pads 625 may be exposed on a circuit layer provided on the bottom surface of the upper semiconductor chip 650.

The chip connection terminals 631 may be provided between the base semiconductor chip 610, the lower semiconductor chips 620, and the upper semiconductor chip 650. The chip connection terminals 631 may be correspondingly disposed between the first upper chip pads 611, the second upper chip pads 621, the second lower chip pads 622, and the third lower chip pads 625. The chip connection terminals 631 may electrically connect the base semiconductor chip 610, the lower semiconductor chips 620, and the upper semiconductor chip 650 to each other.

The non-conductive layers 624 may fill gaps between the base semiconductor chip 610, the lower semiconductor chips 620, and the upper semiconductor chip 650. The non-conductive layers 624 may surround the chip connection terminals 631 between the base semiconductor chip 610, the lower semiconductor chips 620, and the upper semiconductor chip 650. The non-conductive layers 624 may protrude from a lateral surface of the upper semiconductor chip 650 and lateral surfaces of the lower semiconductor chips 620. The non-conductive layers 624 may include a non-conductive film (NCF) or a non-conductive paste (NCP). The non-conductive layers 624 may include a dielectric polymer.

On the base semiconductor chip 610, a second molding layer 660 may surround the upper semiconductor chip 650, the lower semiconductor chips 620, and the non-conductive layers 624. The second molding layer 660 may have a lateral surface vertically aligned with that of the base semiconductor chip 610. For example, the bottom of the second molding layer 660 may be in contact with the top of the base semiconductor chip 610. The second molding layer 660 may expose a top surface of the upper semiconductor chip 650. The second molding layer 660 may have a top surface coplanar with that of the upper semiconductor chip 650. Alternatively, the second molding layer 660 may cover the top surface of the upper semiconductor chip 650. The second molding layer 660 may include an epoxy molding compound (EMC).

The chip stack 600 may be flip-chip mounted on the second substrate 200. Fourth connection terminals 630 may be provided between the chip stack 600 and the second substrate 200. The fourth connection terminals 630 may be disposed to correspond to the first substrate pads 210 of the second substrate 200 and to the first lower chip pads 612 of the base semiconductor chip 610. The chip stack 600 may be mounted through the fourth connection terminals 630 on the second substrate 200. The chip stack 600 may be electrically connected through the second substrate 200 to the first substrate 100. The fourth connection terminals 630 may include solder balls or solder bumps. The fourth connection terminals 630 may be an alloy including at least one selected from tin (Sn), silver (Ag), copper (Cu), nickel (Ni), bismuth (Bi), indium (In), antimony (Sb), and cerium (Ce).

A second under-fill 640 may be provided between the base semiconductor chip 610 and the second substrate 200. The second under-fill 640 may surround the fourth connection terminals 630 between the base semiconductor chip 610 and the second substrate 200. The second under-fill 640 may fill a gap between the fourth connection terminals 630.

The chip stack 600 may be a stacked semiconductor package in which a plurality of semiconductor chips 610, 620, and 650 are stacked. The plurality of semiconductor chips 610, 620, and 650 may be electrically connected to each other through the through electrodes 613 and 623. The chip stack 600 may include, for example, high bandwidth memory (HBM) chips. According to that shown, although four semiconductor chips are stacked on the base semiconductor chip 610, the present inventive concept is not limited thereto, and the number of semiconductor chips stacked on the base semiconductor chip 610 may be variously changed. An increase in the number of semiconductor chips stacked on the base semiconductor chip 610 may increase an increase in storage capacity of the chip stack 600.

Figure 5:
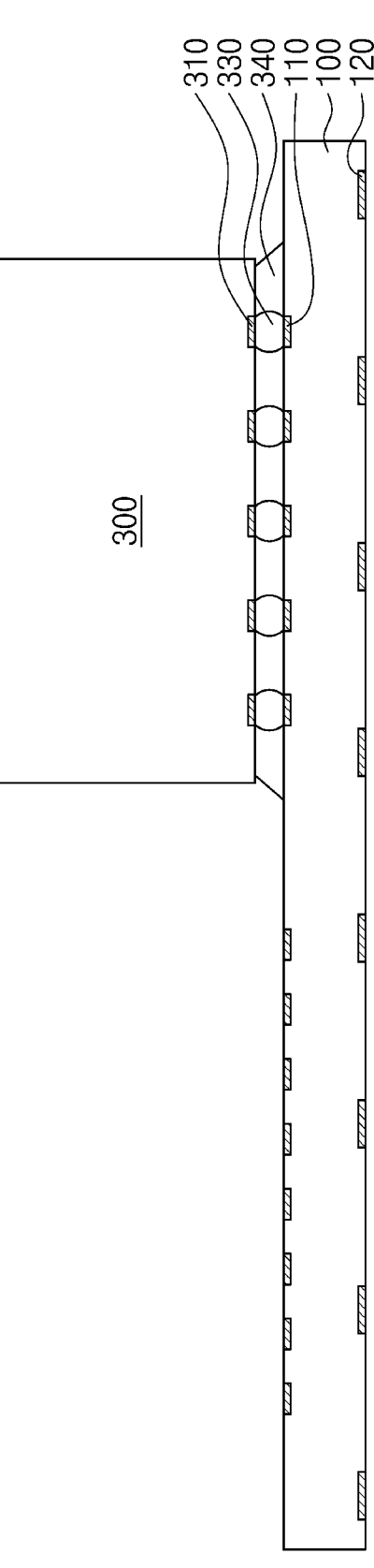
FIGS. 5, 6, 7, 8 and 9 illustrate cross-sectional views showing a method of fabricating a semiconductor package according to some embodiments of the present inventive concept.
Figure 6:
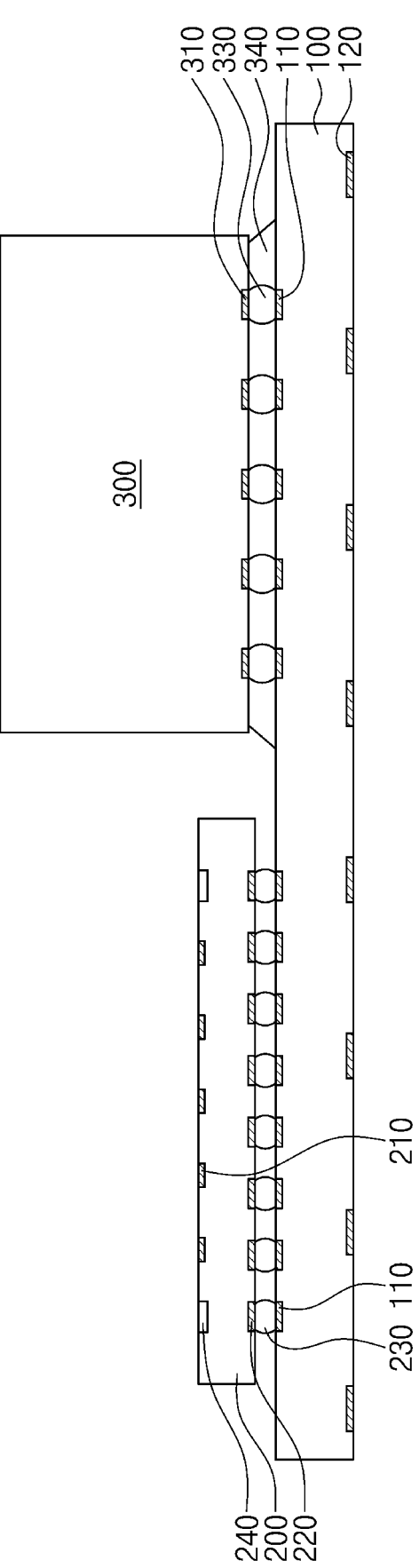

FIGS. 5 to 9 illustrate cross-sectional views showing a method of fabricating a semiconductor package according to some embodiments of the present inventive concept. FIG. 6 illustrates a cross-sectional view showing a semiconductor package according to some embodiments of the present inventive concepts.

Referring to FIG. 5, a first substrate 100 may be provided. The first substrate 100 may correspond to the first substrate 100 discussed with reference to FIGS. 1 to 4.

A first semiconductor chip 300 may be provided on the first substrate 100. The first semiconductor chip 300 may be flip-chip mounted on the first substrate 100. The first semiconductor chip 300 may be mounted through second connection terminals 330 on the first substrate 100. For example, the second connection terminals 330 may be provided on first chip pads 310 of the first semiconductor chip 300, and then the first semiconductor chip 300 may be disposed on the first substrate 100 to allow the second connection terminals 330 to align with upper substrate pads 110 of the first substrate 100. Afterwards, the second connection terminals 330 may undergo a reflow process to allow the second connection terminals 330 to connect with the first chip pads 310 and the upper substrate pads 110.

After the first semiconductor chip 300 is mounted on the first substrate 100, a first under-fill 340 may be formed to surround the second connection terminals 330. The first under-fill 340 may prevent short-circuits between the second connection terminals 330 and improve structural stability of a semiconductor package.

Referring to FIG. 6, a second substrate 200 may be provided on the first substrate 100. The second substrate 200 may be disposed on the first substrate 100 to be horizontally spaced apart from the first semiconductor chip 300. The second substrate 200 may be flip-chip mounted on the first substrate 100. The second substrate 200 may be mounted through first connection terminals 230 on the first substrate 100. For example, the first connection terminals 230 may be provided on second substrate pads 220 of the second substrate 200, and then the second substrate 200 may be disposed on the first substrate 100 to allow the first connection terminals 230 to align with upper substrate pads 110 of the first substrate 100. Afterwards, the first connection terminals 230 may undergo a reflow process to allow the first connection terminals 230 to connect with the second substrate pads 220 and the upper substrate pads 110. The second substrate 200 may have a thickness less than that of the first semiconductor chip 300. A top surface of the second substrate 200 may be closer to the first substrate 100 than a top surface of the first semiconductor chip 300.

Figure 7:
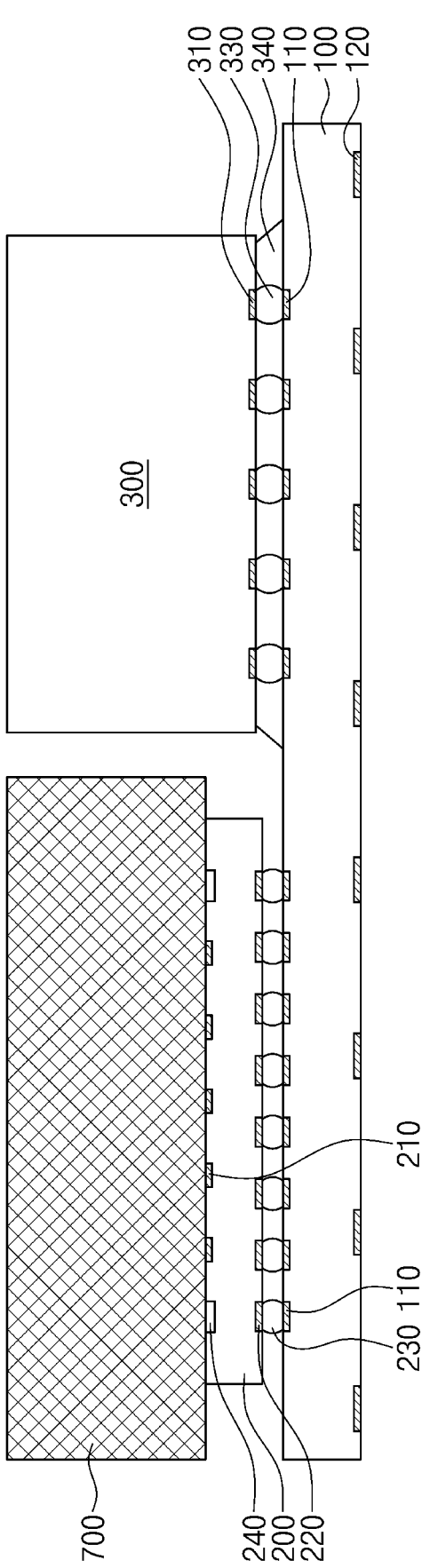

Referring to FIG. 7, a molding die 700 may be provided on the second substrate 200. A bottom surface of the molding die 700 may be in contact with the top surface of the second substrate 200. The molding die 700 may be horizontally spaced apart from the first semiconductor chip 300. For example, gap may exist between the molding die 700 and the first semiconductor chip 300. Alternatively, the molding die 700 may be in contact with a lateral surface of the first semiconductor chip 300 adjacent thereto. The molding die 700 may be spaced apart from the first substrate 100. The molding die 700 may have a width greater than that of the second substrate 200. For example, the molding die 700 may cover an entire top surface of the second substrate 200. A lateral surface of the molding die 700 may be vertically aligned with at least a portion of a lateral surface of the first substrate 100. In other words, a portion of the molding die 700 that extends beyond the side of the second substrate 200 may overlap the first substrate 100. Alternatively, the lateral surface of the molding die 700 may be vertically aligned with at least a portion of a lateral surface of the second substrate 200. The molding die 700 may not expose the top surface of the second substrate 200. The present inventive concept, however, is not limited thereto, and a size of the molding die 700 may be variously changed.

Figure 8:
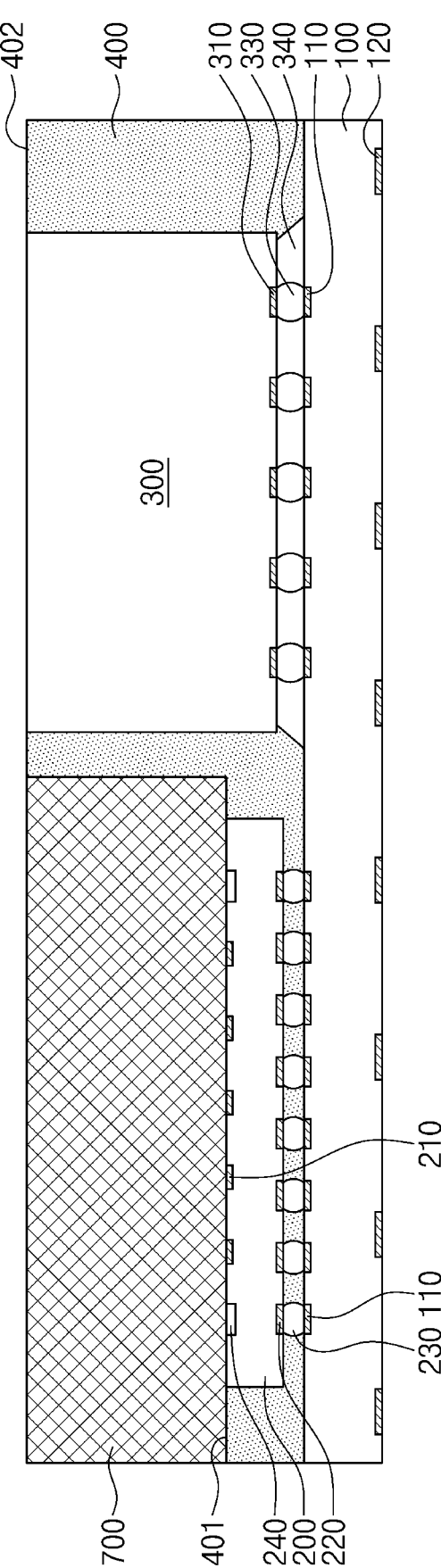

Referring to FIG. 8, a molding member may be coated on the first substrate 100 to fill an empty space in which any of the second substrate 200, the first semiconductor chip 300, and the molding die 700 is not provided on the first substrate 100. The molding member may form, on the first substrate 100, a first molding layer 400 to surround the second substrate 200 and the first semiconductor chip 300. The first molding layer 400 may surround the first connection terminals 230 between the first substrate 100 and the second substrate 200. The molding die 700 may cause the first molding layer 400 to have a first top surface 401 coplanar with the top surface of the second substrate 200. The first molding layer 400 may also have a second top surface 402 coplanar with the top surface of the first semiconductor chip 300. The first top surface 401 may be located at a vertical level lower than that of the second top surface 402. The first top surface 401 may be closer than the second top surface 402 to the first substrate 100.

According to some embodiments of the present inventive concept, a molding member may be coated after the tetragonal molding die 700 to prevent the formation of a molding layer on the top surface of the second substrate 200, but a shape of the molding die 700 may be changed. In addition, the present inventive concept, however, is not limited thereto, and a molding die may be used which surrounds all of the first substrate 100, the second substrate 200, and the first semiconductor chip 300.

Figure 9:
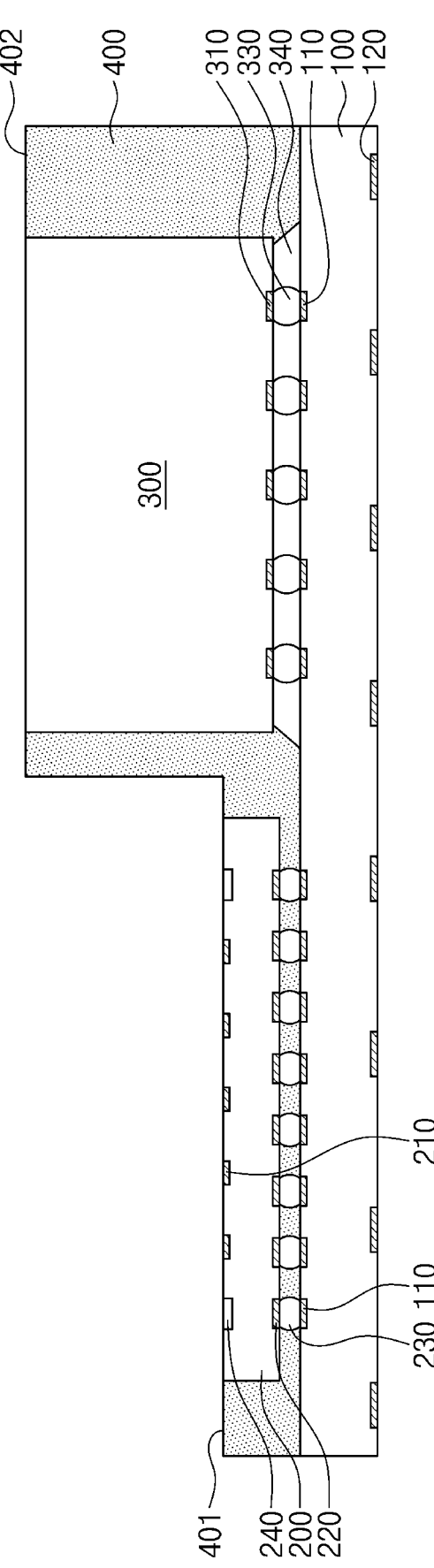

Referring to FIG. 9, after the formation of the first molding layer 400, the molding die 700 may be removed. Therefore, there may be exposed the top surface of the second substrate 200, and there may also be exposed fiducial marks 240 on the top surface of the second substrate 200. An additional semiconductor chip or a chip stack may be stacked between the fiducial marks 240 on the second substrate 200.

Referring back to FIG. 1, substrate connection terminals 130 may be provided on a bottom surface of the first substrate 100. The substrate connection terminals 130 may be disposed on lower substrate pads 120 exposed on the bottom surface of the first substrate 100. A semiconductor package 10 may thus be fabricated.

Figure 10:
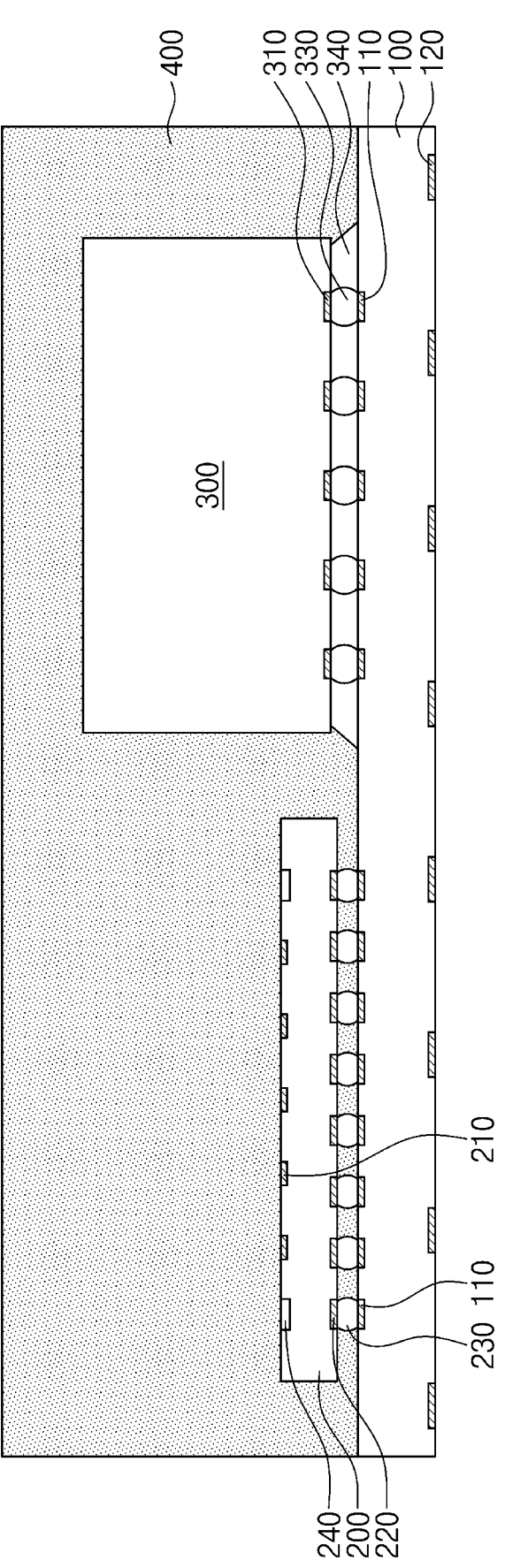
FIGS. 10, 11 and 12 illustrate cross-sectional views showing a method of fabricating a semiconductor package according to some embodiments of the present inventive concept.
Figure 11:
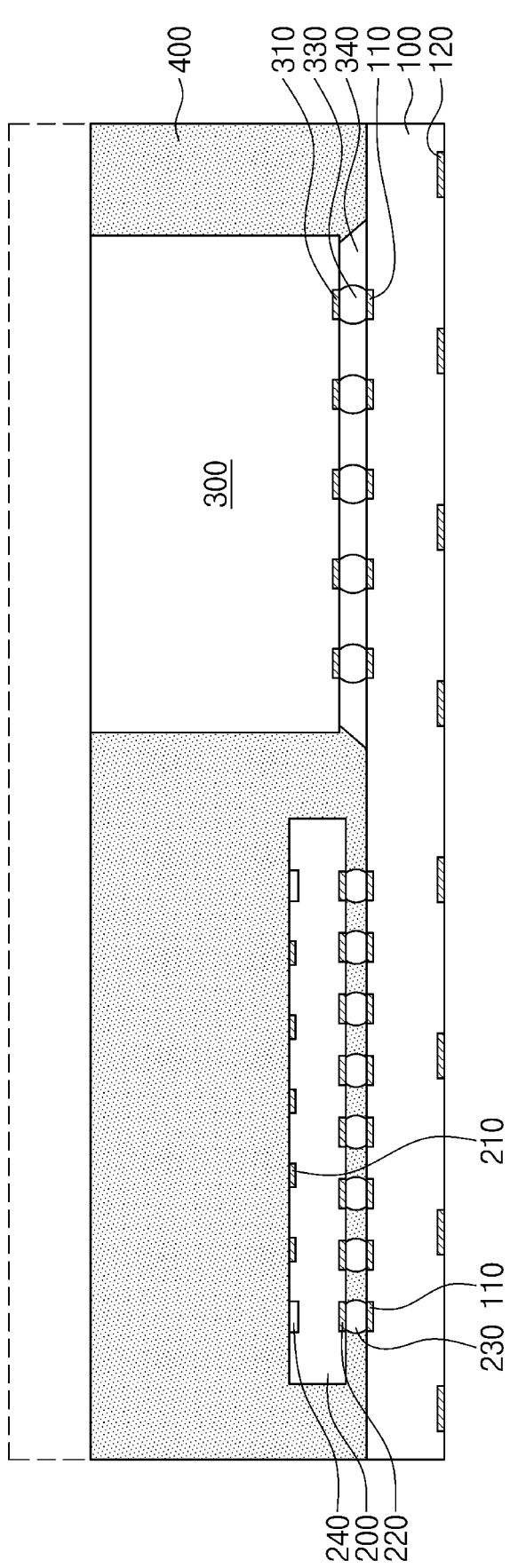
Figure 12:
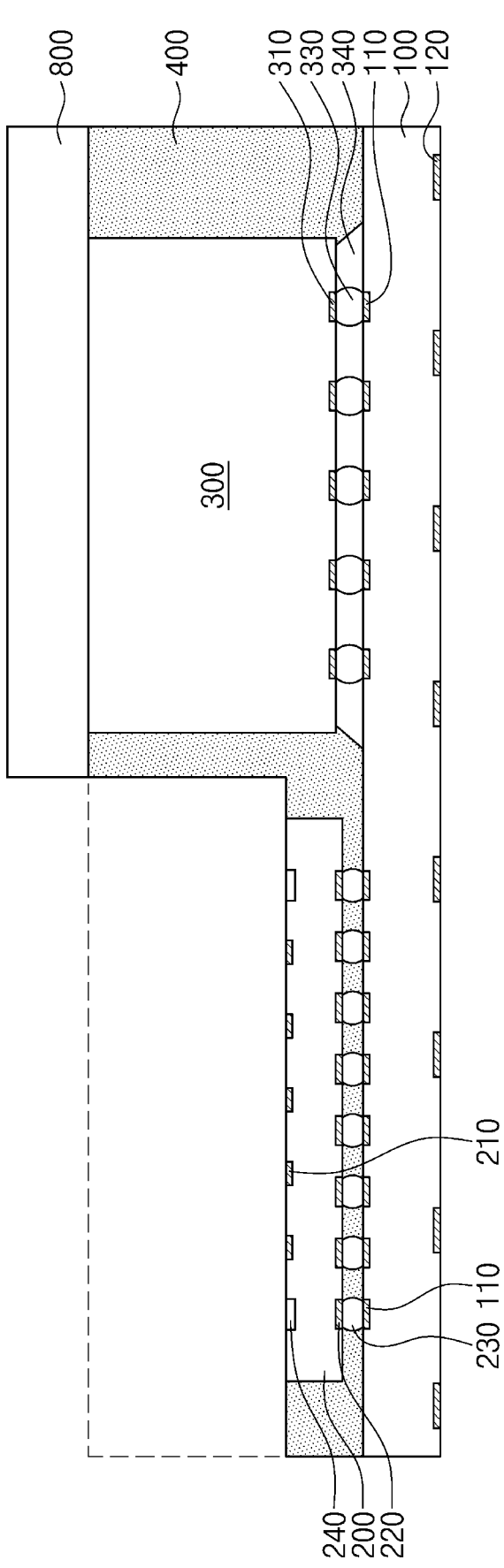

FIGS. 10 to 12 illustrate cross-sectional views showing a method of fabricating a semiconductor package according to some embodiments of the present inventive concept.

As discussed with reference to FIGS. 5 and 6, a first semiconductor chip 300 and a second substrate 200 may be mounted on a first substrate 100.

Referring to FIG. 10, a molding member may be coated to encapsulate the second substrate 200 and the first semiconductor chip 300. The molding member may form, on the first substrate 100, a first molding layer 400 that covers the second substrate 200 and the first semiconductor chip 300. The first molding layer 400 may surround the first connection terminals 230 between the first substrate 100 and the second substrate 200.

Referring to FIG. 11, a first etching process may be performed on the first molding layer 400. The first etching process may partially remove an upper portion of the first molding layer 400. The first etching process may include a planarization process or a thinning process. The first etching process may expose a top surface of the first semiconductor chip 300. An upper portion of the first semiconductor chip 300 may be partially removed together with the first molding layer 400. The first etching process may cause the first molding layer 400 to have a top surface coplanar with that of the first semiconductor chip 300.

Referring to FIG. 12, a mask 800 may be provided on the first semiconductor chip 300. The mask 800 may cover the top surface of the first semiconductor chip 300, and may also cover a portion of the top surface of the first molding layer 400 adjacent to the top surface of the first semiconductor chip 300. The mask 800 may have a width greater than that of the first semiconductor chip 300. The mask 800 may vertically overlap the first semiconductor chip 300, and may not vertically overlap the second substrate 200. For example, when viewed in a plan view, an end of the mask 800 may be positioned between the first semiconductor chip 300 and the second substrate 200. In detail, the mask may be positioned on the first molding layer 400 between the first semiconductor chip 300 and the second substrate 200. After the mask 800 is disposed on the first semiconductor chip 300, a second etching process may be performed. The second etching process may etch the first molding layer 400 where the mask 800 is not provided. For example, the second etching process may etch the top surface of the first molding layer 400 above the second substrate 200. The second etching process may thus remove a portion of the first molding layer 400 formed on the second substrate 200. The second etching process may expose a top surface of the second substrate 200 and fiducial marks 240 provided on the top surface of the second substrate 200. The second etching process may cause the top surface of the second substrate 200 to be coplanar with a portion of the top surface of the first molding layer 400. An additional semiconductor chip or a chip stack may be stacked between the fiducial marks 240 on the second substrate 200.

Referring back to FIG. 1, after the second etching process, the mask 800 may be removed. Substrate connection terminals 130 may be provided on a bottom surface of the first substrate 100. The substrate connection terminals 130 may be disposed on lower substrate pads 120 exposed on the bottom surface of the first substrate 100. A semiconductor package 10 may thus be fabricated.

A semiconductor package according to some embodiments of the present inventive concept may include an interposer substrate and a semiconductor chip that are horizontally spaced apart from each other on a substrate. Thus, heat may be easily discharged through a top surface of the semiconductor chip. In addition, before an additional semiconductor chip is mounted on the interposer substrate, the interposer substrate and the semiconductor chip may be mounted earlier and then molded, with the result that the substrate may be prevented from being warped. Accordingly, it is possible to provide a semiconductor package with increased structural and thermal stability and to increase productivity in the manufacture of the semiconductor package.

Although the present inventive concept has been described in connection with the some embodiments thereof illustrated in the accompanying drawings, it will be understood by one of ordinary skill in the art that variations in form and detail may be made thereto without departing from the scope of the present inventive concept. The above disclosed embodiments should thus be considered illustrative and not restrictive.

What is claimed is:

1. A semiconductor package, comprising:
a first substrate;
a first semiconductor chip and a second substrate horizontally spaced apart from each other on the first substrate; and
a molding layer on the first substrate, the first semiconductor chip and the second substrate,
wherein a thickness of the first semiconductor chip is greater than a thickness of the second substrate,
wherein the molding layer exposes a top surface of the second substrate, and
wherein the second substrate has fiducial marks exposed on the top surface of the second substrate.

2. The semiconductor package of claim 1, wherein a portion of a top surface of the molding layer is coplanar with the top surface of the second substrate.

3. The semiconductor package of claim 1, wherein a portion of a top surface of the molding layer is coplanar with a top surface of the first semiconductor chip.

4. The semiconductor package of claim 1, wherein the molding layer covers a top surface of the first semiconductor chip.

5. The semiconductor package of claim 1, further comprising a second semiconductor chip on the second substrate,
wherein the second semiconductor chip is on the second substrate and between the fiducial marks.

6. The semiconductor package of claim 1, wherein the first semiconductor chip includes a logic chip.

* * * * *